United States Patent
Yudovsky et al.

(10) Patent No.: US 9,765,434 B2
(45) Date of Patent: Sep. 19, 2017

(54) APPARATUS FOR SUSCEPTOR TEMPERATURE VERIFICATION AND METHODS OF USE

(71) Applicant: Applied Materials, Inc., Santa Clara, CA (US)

(72) Inventors: Joseph Yudovsky, Campbell, CA (US); Kevin Griffin, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 4 days.

(21) Appl. No.: 14/689,447

(22) Filed: Apr. 17, 2015

(65) Prior Publication Data
US 2015/0299855 A1    Oct. 22, 2015

Related U.S. Application Data

(60) Provisional application No. 61/981,731, filed on Apr. 18, 2014.

(51) Int. Cl.
C23C 16/52    (2006.01)
C23C 16/455   (2006.01)

(52) U.S. Cl.
CPC ........ *C23C 16/52* (2013.01); *C23C 16/45519* (2013.01); *C23C 16/45551* (2013.01)

(58) Field of Classification Search
None
See application file for complete search history.

(56) References Cited

U.S. PATENT DOCUMENTS

| | | |
|---|---|---|
| 3,539,759 A | 11/1970 | Spiro et al. |
| 4,897,171 A | 1/1990 | Ohmi |
| 5,520,501 A | 5/1996 | Kouno et al. |
| 5,976,261 A * | 11/1999 | Moslehi ............ C23C 16/45574 118/719 |
| 6,197,117 B1 | 3/2001 | Li et al. |
| 6,823,753 B1 | 11/2004 | Beginski |
| 6,950,774 B2 | 9/2005 | Donald |
| 8,357,549 B2 | 1/2013 | Brenninger et al. |
| 8,441,617 B2 | 5/2013 | Hoogendam et al. |
| 2010/0055351 A1 | 3/2010 | Kato et al. |
| 2012/0085278 A1 | 4/2012 | Moslehi et al. |
| 2012/0221138 A1 | 8/2012 | Hong |
| 2012/0225191 A1 | 9/2012 | Yudovsky et al. |
| 2013/0196078 A1 | 8/2013 | Yudovsky et al. |
| 2013/0210238 A1 | 8/2013 | Yudovsky |

FOREIGN PATENT DOCUMENTS

| | | |
|---|---|---|
| EP | 2103720 | 3/2012 |
| KR | 10-2011-0095633 | 8/2011 |
| KR | 10-1302157 | 8/2013 |

OTHER PUBLICATIONS

Lee KR1020110095633 Aug. 2011 Eng machine trans.*
PCT International Search Report and Written Opinion in PCT/US2015/026429, mailed Jul. 27, 2015, 13 pages.
PCT International Preliminary Report on Patentability in PCT/US2015/026429 dated Oct. 27, 2016, 10 pages.

* cited by examiner

*Primary Examiner* — Joseph Miller, Jr.
(74) *Attorney, Agent, or Firm* — Servilla Whitney LLC

(57) ABSTRACT

Apparatus and methods for processing a semiconductor wafer in which a sensor (e.g., a contact thermocouple) is positioned in the gas distribution assembly measures temperature and/or a film parameter before, during and/or after deposition are described.

10 Claims, 5 Drawing Sheets

APPARATUS FOR SUSCEPTOR TEMPERATURE VERIFICATION AND METHODS OF USE

CROSS-REFERENCE TO RELATED APPLICATIONS

This application claims priority to U.S. Provisional Application No. 61/981,731, filed Apr. 18, 2014, the entire disclosure of which is hereby incorporated by reference herein.

FIELD

Embodiments of the disclosure generally relate to apparatus and methods of processing a substrate. In particular, embodiments of the disclosure are directed to apparatus and methods for measuring temperature and other parameters of substrates before, during and/or after processing.

BACKGROUND

The process of forming semiconductor devices is commonly conducted in substrate processing platforms containing multiple processing chambers. In some instances, the purpose of a multi-chamber processing platform, or cluster tool, is to perform two or more processes on a substrate sequentially in a controlled environment. In other instances, a multiple chamber processing platform may perform a single processing step on substrates; the additional chambers used to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for ALD processes and some chemical vapor deposition (CVD) processes.

The effectiveness of a substrate processing platform, or system, is often quantified by cost of ownership (COO). The COO, while influenced by many factors, is largely affected by the system footprint, i.e., the total floor space used to operate the system in a fabrication plant, and system throughput, i.e., the number of substrates processed per hour. Footprint typically includes access areas adjacent the system that are used for maintenance. Hence, although a substrate processing platform may be relatively small, if the system requires access from all sides for operation and maintenance, the system's effective footprint may still be prohibitively large.

The semiconductor industry's tolerance for process variability continues to decrease as the size of semiconductor devices shrink. To meet the tighter process requirements, the industry has developed a host of new processes which often take a longer time to complete. For example, for forming a copper diffusion barrier layer conformally onto the surface of a high aspect ratio, 65 nm or smaller interconnect feature, to use an ALD process may be used. ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by cyclically alternating the pulsing of appropriate reactive precursors into a deposition chamber. Each injection of a reactive precursor, or reactive gas, is typically separated by an inert gas purge to provide a new atomic layer to previous deposited layers to form an uniform material layer on the surface of a substrate. Cycles of reactive precursor and inert purge gases are repeated to form the material layer to a predetermined thickness. The biggest drawback with ALD techniques is that the deposition rate is much lower than typical CVD techniques by at least an order of magnitude. For example, some ALD processes can require a chamber processing time from about 10 to about 200 minutes to deposit a high quality layer on the surface of the substrate. In choosing such ALD and epitaxy processes for better device performance, the cost to fabricate devices in a conventional single substrate processing chamber would increase due to very low substrate processing throughput. Hence, when implementing such processes, a continuous substrate processing approach is needed to be economically feasible.

Evaluating a deposition process dynamically provides a rapid and accurate means to determining the quality of deposited films and process completion. However, optical measurements of a wafer (e.g., temperature, film characteristics) in a carousel-type processing chamber cannot be performed while processing. Positioning optical devices in the processing chamber during deposition (e.g., pyrometers) can be problematic because the optical instruments become fouled by the deposition reaction, rendering them unsuitable for use.

Measuring the temperature of a large platen susceptor in a batch processing system can also be difficult due to the distance between the gas distribution assembly and the susceptor assembly. Therefore, there is a need for apparatus and methods that can accurately measure the susceptor temperature without interfering with the processing chamber functions.

SUMMARY

Embodiments of the disclosure are directed to processing chambers comprising a susceptor assembly and a gas distribution assembly. The susceptor assembly includes a top surface to support and rotate a plurality of substrates around a central axis. The top surface has an inner peripheral edge and an outer peripheral edge. The gas distribution assembly is above the susceptor assembly and comprises a plurality of elongate gas ports to direct flows of gases toward the susceptor assembly and at least one sensor positioned to contact the susceptor assembly during measurement.

Additional embodiments of the disclosure are directed to processing chambers comprising a susceptor assembly, a gas distribution assembly and a contact thermocouple. The susceptor assembly includes a top surface to support and rotate a plurality of substrates around a central axis. The top surface has an inner peripheral edge and an outer peripheral edge. The gas distribution assembly is above the susceptor assembly and comprises a plurality of elongate gas ports to direct flows of gases toward the susceptor assembly. The contact thermocouple is positioned within an inert gas region of the gas distribution assembly to contact the susceptor assembly during measurement.

Further embodiments of the disclosure are directed to methods of processing at least one substrate in a processing chamber. The at least one substrate is positioned in a recess in a top surface of a susceptor assembly. The substrate has a top surface. The substrate and susceptor assembly are passed under a gas distribution assembly comprising a plurality of substantially parallel gas channels directing flows of gases toward the top surface of the substrate to deposit a film on the top surface of the substrate. A measurement is taken from a sensor positioned at an inert region of the gas distribution assembly.

BRIEF DESCRIPTION OF THE DRAWINGS

So that the manner in which the above recited features of the disclosure are attained and can be understood in detail, a more particular description of the disclosure, briefly summarized above, may be had by reference to the embodiments thereof which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure are directed to apparatus and methods for taking optical measurements of a wafer before, during and/or after processing. As used in this specification and the appended claims, the term "substrate" and "wafer" are used interchangeably, referring to a surface, or portion of a surface, upon which a process acts. It will also be understood by those skilled in the art that reference to a substrate can also refer to a portion of the substrate, unless the context clearly indicates otherwise. For example, in spatially separated ALD, described with respect to FIG. 1, each precursor is delivered to the substrate, but any individual precursor stream, at any given time, is only delivered to a portion of the substrate. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that comprises a species which is reactive in an atomic layer deposition process. For example, a first "reactive gas" may simply adsorb onto the surface of a substrate and be available for further chemical reaction with a second reactive gas.

Embodiments of the disclosure provide apparatus and methods to take optical measurements during carousel processing. As used in this specification and the appended claims, the term "during carousel processing," and the like, means that the subject action can be taken at any point in a process sequence, including, but not limited to, wafer loading/unloading and deposition. Those skilled in the art will understand that some measurements can be taken while the susceptor is rotating while some measurements may be taken when the susceptor is stationary. The timing of the measurement can depend on, for example, the type of measurement and the type of measurement device.

The carousel spatial ALD showerhead of one or more embodiments has segregated sections within the injector design which are substantially free of reactive gas flows. Therefore, no film can be deposited on an optical instrument positioned in the segregated sections locations. Due to the segregated sections within the injector design, pyrometers, interferometers and related devices can be installed to gain active temperature and film characterization data of the actual process environment. Data can be acquired before, during and/or after processing. The placement of the optical instruments can read the susceptor or wafer at the inner diameter, middle or outer diameter regions from the top side of the wafer.

Figure 1:
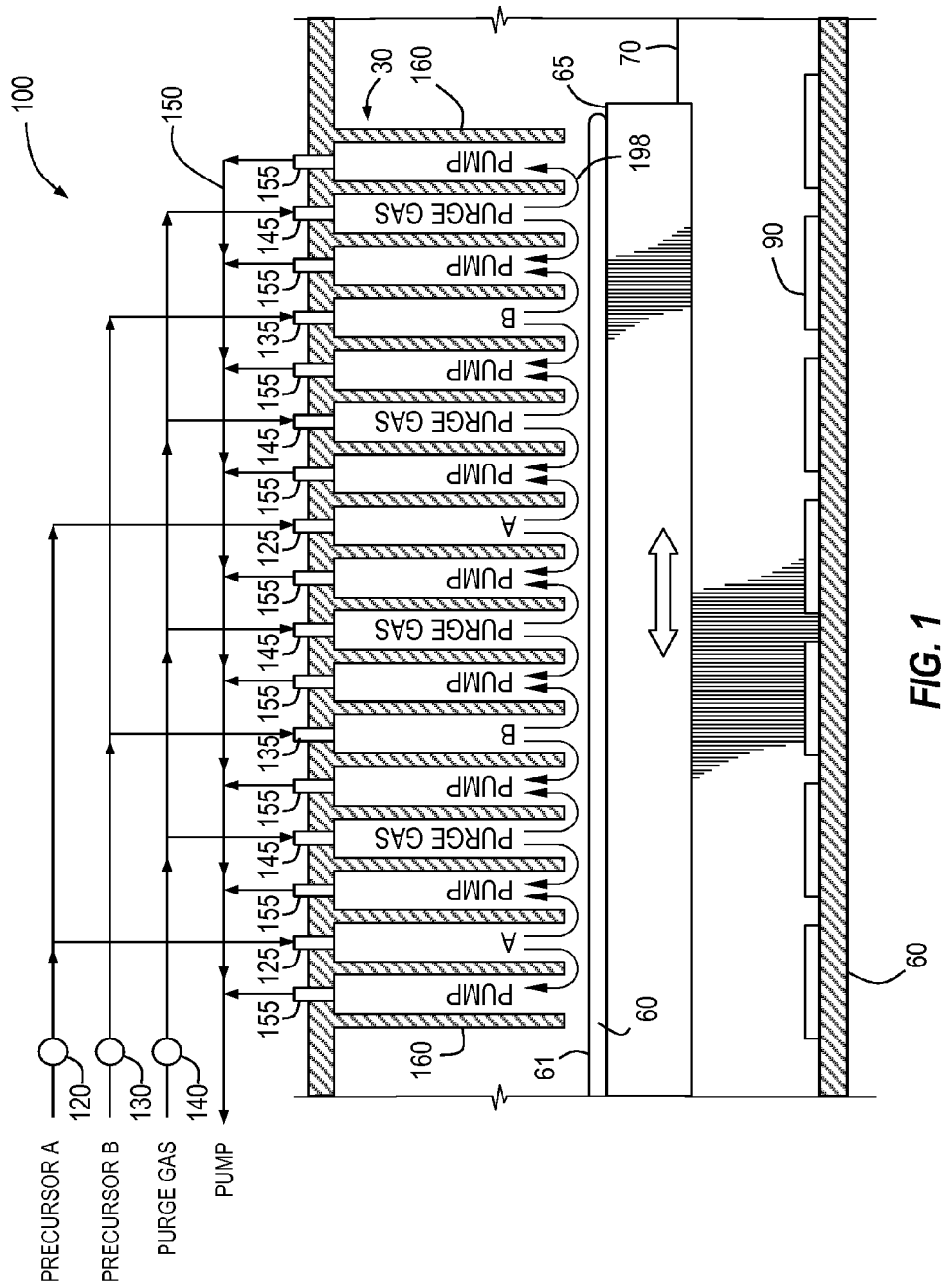
FIG. 1 is a partial cross-sectional side view of a spatial atomic layer deposition chamber in accordance with one or more embodiment of the disclosure.

FIG. 1 is a schematic cross-sectional view of a portion of a processing chamber 20 in accordance with one or more embodiments of the disclosure. The processing chamber 20 is generally a sealable enclosure, which is operated under vacuum, or at least low pressure conditions. The chamber 100 includes a gas distribution assembly 30 capable of distributing one or more gases across the top surface 61 of a substrate 60. The gas distribution assembly 30 can be any suitable assembly known to those skilled in the art, and specific gas distribution assemblies described should not be taken as limiting the scope of the disclosure. The output face of the gas distribution assembly 30 faces the first surface 61 of the substrate 60.

Substrates for use with the embodiments of the disclosure can be any suitable substrate. In some embodiments, the substrate is a rigid, discrete, generally planar substrate. As used in this specification and the appended claims, the term "discrete" when referring to a substrate means that the substrate has a fixed dimension. The substrate of one or more embodiments is a semiconductor substrate, such as a 200 mm or 300 mm diameter silicon substrate. In some embodiments, the substrate is one or more of silicon, silicon germanium, gallium arsenide, gallium nitride, germanium, gallium phosphide, indium phosphide, sapphire and silicon carbide.

The gas distribution assembly 30 comprises a plurality of gas ports to transmit one or more gas streams to the substrate 60 and a plurality of vacuum ports disposed between each gas port to transmit the gas streams out of the processing chamber 20. In the embodiment of FIG. 1, the gas distribution assembly 30 comprises a first precursor injector 120, a second precursor injector 130 and a purge gas injector 140. The injectors 120, 130, 140 may be controlled by a system computer (not shown), such as a mainframe, or by a chamber-specific controller, such as a programmable logic controller. The precursor injector 120 injects a continuous (or pulse) stream of a reactive precursor of compound A into the processing chamber 20 through a plurality of gas ports 125. The precursor injector 130 injects a continuous (or pulse) stream of a reactive precursor of compound B into the processing chamber 20 through a plurality of gas ports 135. The purge gas injector 140 injects a continuous (or pulse) stream of a non-reactive or purge gas into the processing chamber 20 through a plurality of gas ports 145. The purge gas removes reactive material and reactive by-products from the processing chamber 20. The purge gas is typically an inert gas, such as, nitrogen, argon and helium. Gas ports 145 are disposed in between gas ports 125 and gas ports 135 so as to separate the precursor of compound A from the precursor of compound B, avoiding cross-contamination between the precursors.

In another aspect, a remote plasma source (not shown) may be connected to the precursor injector 120 and the precursor injector 130 prior to injecting the precursors into the processing chamber 20. The plasma of reactive species may be generated by applying an electric field to a compound within the remote plasma source. Any power source that is capable of activating the intended compounds may be used. For example, power sources using DC, radio frequency (RF), and microwave (MW) based discharge techniques may be used. If an RF power source is used, the power source can be either capacitively or inductively coupled. The activation may also be generated by a thermally based technique, a gas breakdown technique, a high energy light source (e.g., UV energy), or exposure to an x-ray source. Exemplary remote plasma sources are available from vendors such as MKS Instruments, Inc. and Advanced Energy Industries, Inc.

The chamber 100 further includes a pumping system 150 connected to the processing chamber 20. The pumping system 150 is generally configured to evacuate the gas streams out of the processing chamber 20 through one or more vacuum ports 155. The vacuum ports 155 are disposed between each gas port so as to evacuate the gas streams out of the processing chamber 20 after the gas streams react with the substrate surface and to further limit cross-contamination between the precursors. The chamber 100 includes a plurality of partitions 160 disposed on the processing chamber 20 between each port. A lower portion of each partition extends close to the first surface 61 of substrate 60, for example, about 0.5 mm or greater from the first surface 61. In this manner, the lower portions of the partitions 160 are separated from the substrate surface by a distance sufficient to allow the gas streams to flow around the lower portions toward the vacuum ports 155 after the gas streams react with the substrate surface. Arrows 198 indicate the direction of the gas streams. Since the partitions 160 operate as a physical barrier to the gas streams, they also limit cross-contamination between the precursors. The arrangement shown is merely illustrative and should not be taken as limiting the scope of the disclosure. It will be understood by those skilled in the art that the gas distribution system shown is merely one possible distribution system and the other types of showerheads and gas distribution assemblies may be employed.

Figure 3:
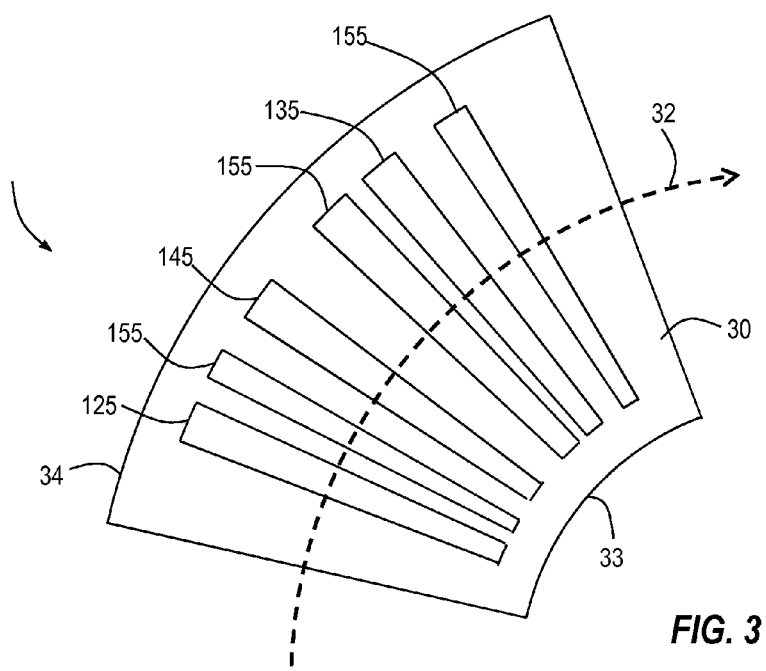
FIG. 3 shows a schematic of a pie-shaped gas distribution assembly in accordance with one or more embodiments of the disclosure.

Atomic layer deposition systems of this sort (i.e., where multiple gases are separately flowed toward the substrate at the same time) are referred to as spatial ALD. In operation, a substrate 60 is delivered (e.g., by a robot) to the processing chamber 20 and can be placed on a shuttle 65 before or after entry into the processing chamber. The shuttle 65 is moved along the track 70, or some other suitable movement mechanism, through the processing chamber 20, passing beneath (or above) the gas distribution assembly 30. In the embodiment shown in FIG. 1, the shuttle 65 is moved in a linear path through the chamber. FIG. 3, as explained further below, shows an embodiment in which wafers are moved in a circular path through a carousel processing system.

Referring back to FIG. 1, as the substrate 60 moves through the processing chamber 20, the first surface 61 of substrate 60 is repeatedly exposed to the reactive gas A coming from gas ports 125 and reactive gas B coming from gas ports 135, with the purge gas coming from gas ports 145 in between. Injection of the purge gas is designed to remove unreacted material from the previous precursor prior to exposing the substrate surface 110 to the next precursor. After each exposure to the various gas streams (e.g., the reactive gases or the purge gas), the gas streams are evacuated through the vacuum ports 155 by the pumping system 150. Since a vacuum port may be disposed on both sides of each gas port, the gas streams are evacuated through the vacuum ports 155 on both sides. Thus, the gas streams flow from the respective gas ports vertically downward toward the first surface 61 of the substrate 60, across the substrate surface 110 and around the lower portions of the partitions 160, and finally upward toward the vacuum ports 155. In this manner, each gas may be uniformly distributed across the substrate surface 110. Arrows 198 indicate the direction of the gas flow. Substrate 60 may also be rotated while being exposed to the various gas streams. Rotation of the substrate may be useful in preventing or minimizing the formation of strips in the formed layers. Rotation of the substrate can be continuous or in discrete steps and can occur while the substrate is passing beneath the gas distribution assembly 30 or when the substrate is in a region before and/or after the gas distribution assembly 30.

Sufficient space is generally provided after the gas distribution assembly 30 to ensure complete exposure to the last gas port. Once the substrate 60 has passed beneath the gas distribution assembly 30, the first surface 61 has been exposed to every gas port in the processing chamber 20. The substrate can be transported back in the opposite direction or forward. If the substrate 60 moves in the opposite direction, the substrate surface may be exposed again to the reactive gas A, the purge gas, and reactive gas B, in reverse order from the first exposure.

The extent to which the substrate surface 110 is exposed to each gas may be determined by, for example, the flow rates of each gas coming out of the gas port and the rate of movement of the substrate 60. In one embodiment, the flow rates of each gas are controlled so as not to remove adsorbed precursors from the substrate surface 61. The width between each partition, the number of gas ports disposed on the processing chamber 20, and the number of times the substrate is passed across the gas distribution assembly may also determine the extent to which the substrate surface 61 is exposed to the various gases. Consequently, the quantity and quality of a deposited film may be optimized by varying the above-referenced factors.

Although description of the process has been made with the gas distribution assembly 30 directing a flow of gas downward toward a substrate positioned below the gas distribution assembly, those skilled in the art will understand that this orientation can be different. In some embodiments, the gas distribution assembly 30 directs a flow of gas upward toward a substrate surface. As used in this specification and the appended claims, the term "passed across" means that the substrate has been moved from one side of the gas distribution assembly to the other side so that the entire surface of the substrate is exposed to each gas stream from the gas distribution plate. Absent additional description, the term "passed across" does not imply any particular orientation of gas distribution assemblies, gas flows or substrate positions.

In some embodiments, the shuttle 65 is a susceptor 66 for carrying the substrate 60. Generally, the susceptor 66 is a carrier which helps to form a uniform temperature across the substrate. The susceptor 66 is movable in both directions (left-to-right and right-to-left, relative to the arrangement of FIG. 1) or in a circular direction (relative to FIG. 3). The susceptor 66 has a top surface 67 for carrying the substrate 60. The susceptor 66 may be a heated susceptor so that the substrate 60 may be heated for processing. As an example, the susceptor 66 may be heated by radiant heat lamps 90, a heating plate, resistive coils, or other heating devices, disposed underneath the susceptor 66.

Figure 2:
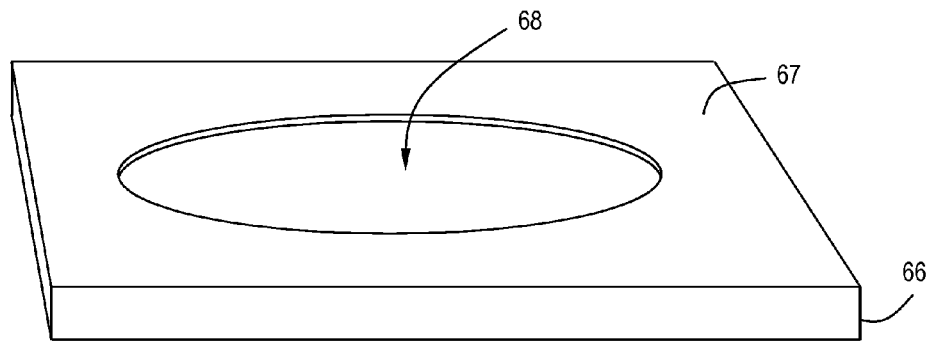
FIG. 2 shows a perspective view of a susceptor in accordance with one or more embodiments of the disclosure.

In another embodiment, the top surface 67 of the susceptor 66 includes a recess 68 to accept the substrate 60, as shown in FIG. 2. The susceptor 66 is generally thicker than the thickness of the substrate so that there is susceptor material beneath the substrate. In some embodiments, the recess 68 is sized such that when the substrate 60 is disposed inside the recess 68, the first surface 61 of substrate 60 is level with, or substantially coplanar with, the top surface 67 of the susceptor 66. Stated differently, the recess 68 of some embodiments is sized such that when a substrate 60 is disposed therein, the first surface 61 of the substrate 60 does not protrude above the top surface 67 of the susceptor 66. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

FIG. 1 shows a cross-sectional view of a processing chamber in which the individual gas ports are shown. This embodiment can be either a linear processing system in which the width of the individual gas ports is substantially the same across the entire width of the gas distribution plate, or a pie-shaped segment in which the individual gas ports change width to conform to the pie shape. FIG. 3 shows a portion of a pie-shaped gas distribution assembly 30. A substrate would be passed across this gas distribution assembly 30 in an arc shape path 32. Each of the individual gas ports 125, 135, 145, 155 extend from an inner peripheral region to an outer peripheral region of the gas distribution assembly 30 and have a narrower width near the inner peripheral edge 33 of the gas distribution assembly 30 a and a larger width near the outer peripheral edge 34 of the gas distribution assembly 30. The shape or aspect ratio of the individual ports can be proportional to, or different from, the shape or aspect ratio of the gas distribution assembly 30 segment. In some embodiments, the individual ports are shaped so that each point of a wafer passing across the gas distribution assembly 30 following path 32 would have about the same residence time under each gas port. The path of the substrates can be perpendicular to the gas ports. In some embodiments, each of the gas distribution assemblies comprises a plurality of elongate gas ports which extend in a direction substantially perpendicular to the path traversed by a substrate. As used in this specification and the appended claims, the term "substantially perpendicular" means that the general direction of movement is approximately perpendicular to the axis of the gas ports. For a pie-shaped gas port, the axis of the gas port can be considered to be a line defined as the mid-point of the width of the port extending along the length of the port.

Figure 4:
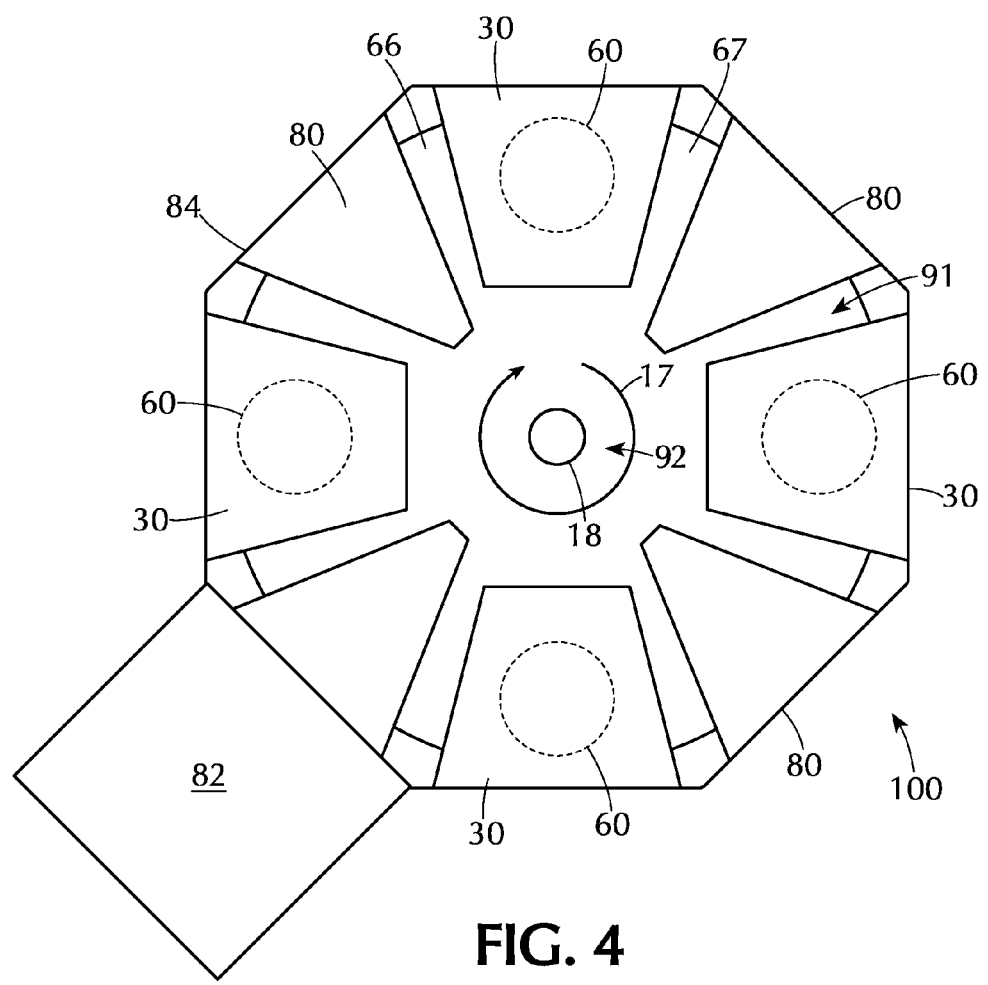
FIG. 4 is a schematic plan view of a substrate processing system configured with four gas distribution assemblies and four inductively coupled pie-shaped plasma sources with a loading station in accordance with one or more embodiments of the disclosure.

Processing chambers having multiple gas injectors can be used to process multiple wafers simultaneously so that the wafers experience the same process flow. For example, as shown in FIG. 4, the processing chamber 100 has four gas distribution assemblies 30 and four substrates 60. At the outset of processing, the substrates 60 can be positioned between the gas distribution assemblies 30. Rotating the susceptor 66 of the carousel by 45° will result in each substrate 60 being moved to an gas distribution assembly 30 for film deposition. An additional 45° rotation would move the substrates 60 away from the gas distribution assemblies 30. This is the position shown in FIG. 4. With spatial ALD injectors, a film is deposited on the wafer during movement of the wafer relative to the injector assembly. In some embodiments, the susceptor 66 is rotated so that the substrates 60 do not stop beneath the gas distribution assemblies 30. The number of substrates 60 and gas distribution assemblies 30 can be the same or different. In some embodiments, there are the same numbers of wafers being processed as there are gas distribution assemblies. In one or more embodiments, the number of wafers being processed are an integer multiple of the number of gas distribution assemblies. For example, if there are four gas distribution assemblies, there are 4x wafers being processed, where x is an integer value greater than or equal to one.

The processing chamber 100 shown in FIG. 4 is merely representative of one possible configuration and should not be taken as limiting the scope of the disclosure. Here, the processing chamber 100 includes a plurality of gas distribution assemblies 30. In the embodiment shown, there are four gas distribution assemblies 30 evenly spaced about the processing chamber 100. The processing chamber 100 shown is octagonal, however, those skilled in the art will understand that this is one possible shape and should not be taken as limiting the scope of the disclosure. The gas distribution assemblies 30 shown are trapezoidal, but those skilled in the art will understand that the gas distribution assemblies can be any suitable shape, for example, pie-shaped segments like that shown in FIG. 3.

The processing chamber 100 includes a substrate support apparatus, shown as a round susceptor 66 or susceptor assembly. The substrate support apparatus, or susceptor 66, is capable of moving a plurality of substrates 60 beneath each of the gas distribution assemblies 30. A load lock 82 might be connected to a side of the processing chamber 100 to allow the substrates 60 to be loaded/unloaded from the chamber 100.

In some embodiments, the processing chamber comprises a plurality of gas curtains (not shown) positioned between the gas distribution assemblies 30 and the plasma stations 80. Each gas curtain can creates a barrier to prevent, or minimize, the movement of processing gases from the gas distribution assemblies 30 from migrating from the gas distribution assembly regions and gases from the plasma sources 80 from migrating from the plasma regions. The gas curtain can include any suitable combination of gas and vacuum streams which can isolate the individual processing sections from the adjacent sections. In some embodiments, the gas curtain is a purge (or inert) gas stream. In one or more embodiments, the gas curtain is a vacuum stream that removes gases from the processing chamber. In some embodiments, the gas curtain is a combination of purge gas and vacuum streams so that there are, in order, a purge gas stream, a vacuum stream and a purge gas stream. In one or more embodiments, the gas curtain is a combination of vacuum streams and purge gas streams so that there are, in order, a vacuum stream, a purge gas stream and a vacuum stream.

In some embodiments, sensors are positioned within the purge gas ports of a gas distribution assembly in a spatial ALD processing chamber. While the sensors may be shown in the purge gas ports, those skilled in the art will understand that the sensors can be placed at any suitable location. Positioning the sensors in the purge gas channel may help minimize or eliminate sensor exposure to corrosive chemicals or deposition gases which may decrease the accuracy and/or precision of the sensors.

In one or more embodiments, contact sensors which move between non-contact and contact positions are included. When not in use, the contact sensors can be retracted to a non-contact position where up to the entire sensor is enveloped in an inert gas shroud. When employed, the contact sensors are extended from the purge gas channel to a contact position where they touch the susceptor assembly.

Large batch processing chambers can have any suitable number of sensors positioned about the interior of the processing chamber. In some embodiments there are 1 or 2 sensors in each of the purge gas ports. The sensors can be any type of suitable sensor including, but not limited to, contact thermocouples and pyrometers. The type of sensors used can be the same throughout the processing chamber, or can include different types. For example, in one or more embodiments, each of the purge gas ports has a contact thermocouple and a pyrometer.

During processing, monitoring the temperature of the susceptor assembly and/or wafers or monitoring a specific property of the film being deposited may be useful. For example, measuring the emissivity of the film during formation. Embodiments of the disclosure have a sensor on or in the gas distribution assembly which can directly measure temperature, and a number of other, parameters during processing. Those skilled in the art will understand that the term "during processing" can mean while the susceptor is moving, or during a pause in rotation.

Figure 5:
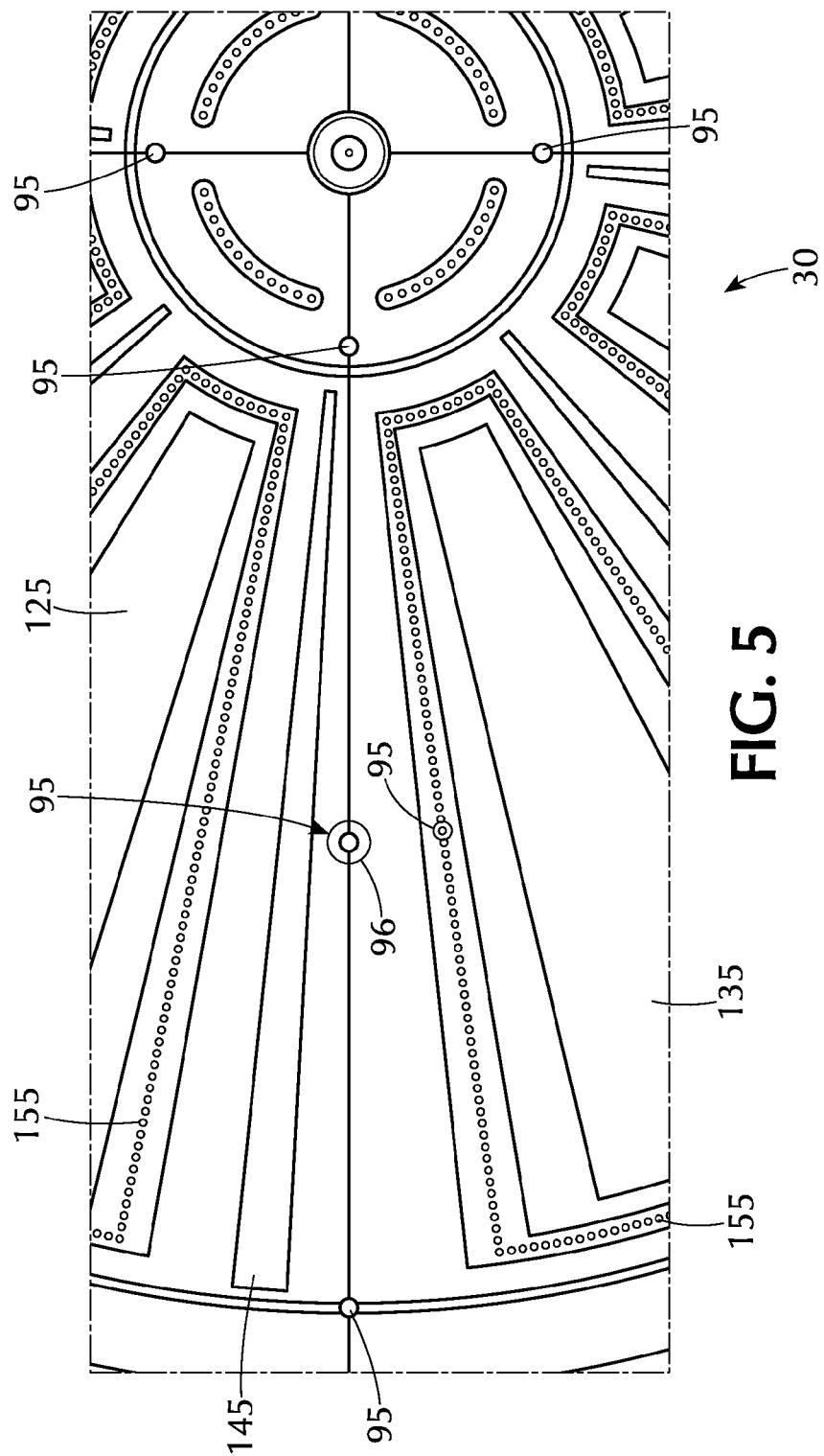
FIG. 5 is a front view of a gas distribution plate with sensors in accordance with one or more embodiment of the disclosure.

Accordingly, one or more embodiments of the disclosure are directed to a processing chamber comprising a susceptor assembly 66 and a gas distribution assembly 30. The susceptor assembly 66 includes a top surface 67 to support and rotate a plurality of substrates 60 around 17 a central axis 18. The top surface 67 of the susceptor assembly 66 has an inner peripheral edge 92 and an outer peripheral edge 91. The gas distribution assembly 30 is positioned above the susceptor assembly 66. As shown in FIG. 5, the gas distribution assembly 30 comprises a plurality of elongate gas ports 125, 135, 145 to direct flows of gases toward the susceptor assembly 66 and elongate vacuum ports 155 to direct flows of gases out of the processing chamber. In some embodiments, the elongate gas ports include a first reactive gas port (i.e., gas port 125) that delivers a first reactive gas and a second reactive gas port (i.e., gas ports 135) that delivers a second reactive gas. The elongate gas ports may also include at least one vacuum port. The gas distribution assembly 30 also includes at least one sensor 95 directed toward the susceptor assembly 66. In some embodiments, the at least on sensor 95 comprises a contact thermocouple and is positioned to touch the surface of the susceptor assembly 66.

The sensors 95 shown in FIG. 5 are located between a vacuum port 155 (also referred to as a pump port) and a purge port 145, which may be referred to as an inert region or inert gas region. The inert region, or inert gas region, is an area in which the gases are substantially inert relative to the sensors. In the inert region, in theory, only purge gases and/or vacuum streams might come into contact with the sensor 95. In some embodiments, the sensor 95 is located within a purge gas port 145. In this position, in theory, only purge gases can flow past the sensor 95 and may keep a steady flow of inert gas (i.e., forming an inert gas envelope) around the sensor 95. The sensors 95 are positioned to measure points on the susceptor assembly near the inner peripheral edge and the outer peripheral edge of the susceptor assembly, as well as a middle region which could be a susceptor assembly or wafer, depending on at what point measurement is taken during processing.

The sensor 95 can be positioned directly on the surface of the gas distribution assembly 30 or in a recess or hole 96 in the gas distribution plate. The hole 96 can be any suitable size depending on the size of the sensor 95. In some embodiments, the hole 96 is up to about 10 mm in diameter. In some embodiments, there is at least one hole 95 in which at least one sensor 95 can be positioned.

In some embodiments, the sensor 95 comprises one or more of a contact thermocouple, contact thermistor or contact resistance temperature detector. As used in this specification and the appended claims, the term "contact thermocouple" is used to describe any type of temperature measurement sensor that contacts the surface being measured.

Figure 6:
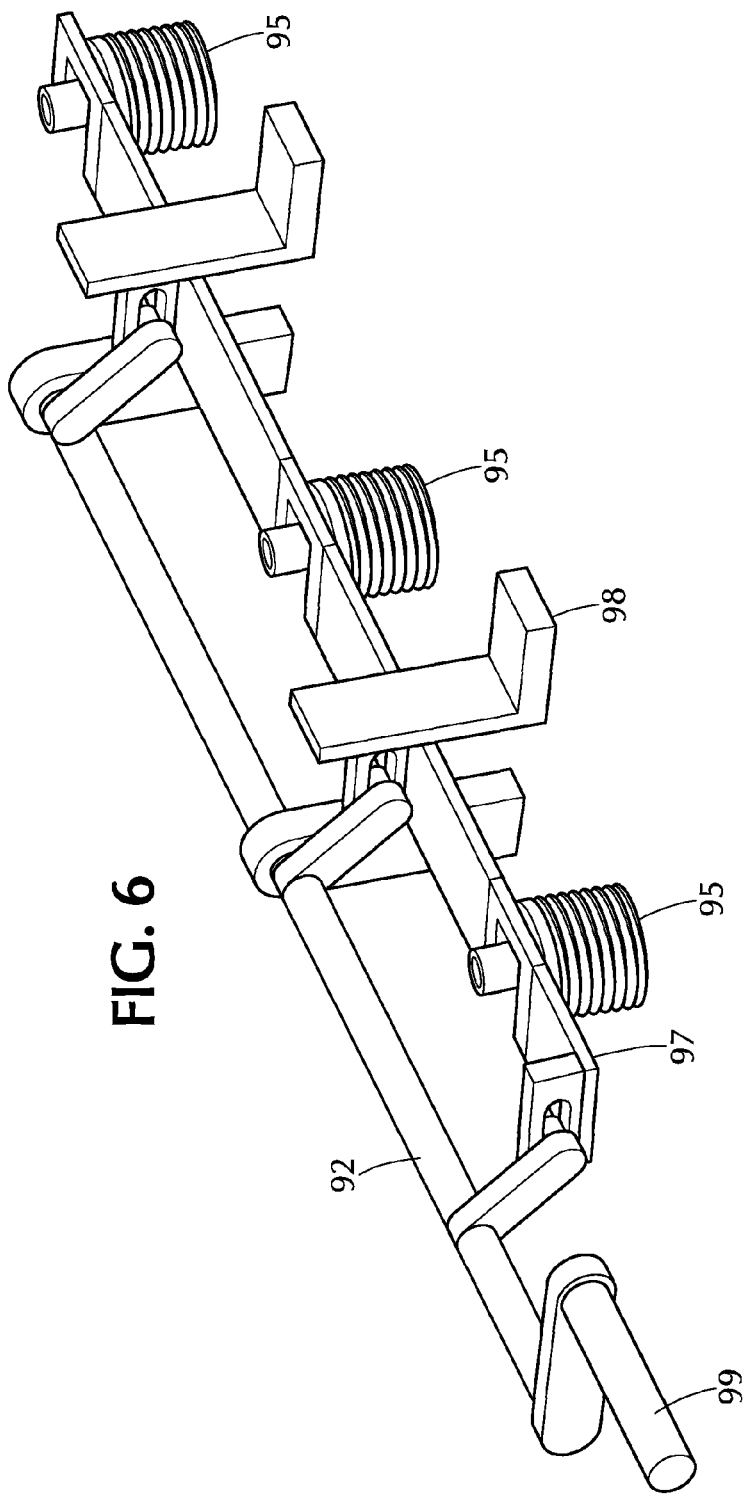
FIG. 6 shows a movable contact thermocouple in accordance with one or more embodiments of the disclosure.

FIG. 6 shows another embodiment of the disclosure with a movable contact sensor 95. Here, three sensors 95 are connected to a support bar 97 which is moved by a handle 99 connected to a lever 92. The position of the base 98 is fixed so that the support bar 97 can slide, or move, between non-contact and contact positions. The embodiment shown in FIG. 6 includes a manual handle 99 but those skilled in the art will understand that a motorized actuator can be employed which can be controlled by any suitable controller, such as the controller that handles the rest of the processing chamber systems.

In some embodiments, there are at least two contact thermocouples to measure temperature. At least one of the contact thermocouples is positioned to measure temperature near the inner peripheral edge of the susceptor assembly and at least one of the contact thermocouples is positioned to measure temperature near the outer peripheral edge of the susceptor assembly.

Although the disclosure herein has been described with reference to particular embodiments, the embodiments are merely illustrative of the principles and applications of the present disclosure. Those skilled in the art will understand that various modifications and variations can be made to the method and apparatus of the present disclosure without departing from the spirit and scope of the disclosure. Thus, the present disclosure includes modifications and variations that are within the scope of the appended claims and their equivalents.

What is claimed is:

1. A processing chamber comprising:
   a susceptor assembly including a top surface to support and rotate a plurality of substrates around a central axis, the top surface having an inner peripheral edge and an outer peripheral edge, the top surface including a plurality of recesses formed therein, the recesses sized to support an edge of a wafer so that a wafer supported in the recess has a top surface substantially coplanar with the top surface of the susceptor assembly; and
   a gas distribution assembly above the susceptor assembly, the gas distribution assembly comprising a plurality of elongate gas ports to direct flows of gases toward the susceptor assembly, the elongate gas ports including a first reactive gas port, a second reactive gas port, a purge gas port and at least one vacuum port, the gas distribution assembly including at least one sensor positioned to contact the susceptor assembly during measurement, the sensor positioned in an inert gas region of the gas distribution assembly between the first reactive gas port and the second reactive gas port so that substantially only purge gases come into contact with the sensor while a first reactive gas is flowing through the first reactive gas port and a second reactive gas is flowing through the second reactive gas port, the at least one sensor connected to a support bar connected to a base, the base fixed so that the support bar can move between non-contact and contact positions to move the at least one sensor connected to the support bar between a non-contact and contact position.

2. The processing chamber of claim 1, wherein the at least one sensor is positioned within a purge gas port.

3. The processing chamber of claim 1, wherein the at least one sensor is positioned within a hole.

4. The processing chamber of claim 1, wherein the at least one sensor comprises a contact thermocouple.

5. The processing chamber of claim 4, wherein the contact thermocouple moves from a non-contact position to a contact position for measurement.

6. The processing chamber of claim 5, wherein there are at least two sensors to measure temperature, at least one sensor positioned to measure temperature near the inner peripheral edge of the susceptor assembly and at least one sensor positioned to measure temperature near the outer peripheral edge of the susceptor assembly.

7. The processing chamber of claim 1, further comprising a controller in communication with the at least one sensor to analyze data from the sensor.

8. A processing chamber comprising:

a susceptor assembly including a top surface to support and rotate a plurality of substrates around a central axis, the top surface having an inner peripheral edge and an outer peripheral edge and a plurality of recesses sized so that a wafer supported in the recess has a top surface substantially coplanar with the top surface of the susceptor assembly;

a gas distribution assembly above the susceptor assembly, the gas distribution assembly comprising a plurality of elongate gas ports to direct flows of gases toward the susceptor assembly, the elongate gas ports including a first reactive gas port and a second reactive gas port, the first reactive gas port and second reactive gas port separated by an inert gas port with vacuum ports on either side of the inert gas port, the vacuum ports and inert gas port forming an inert gas region; and at least two contact thermocouples positioned within the inert gas region of the gas distribution assembly to contact the susceptor assembly during measurement, at least one contact thermocouple positioned to measure temperature near the inner peripheral edge of the susceptor assembly and at least one contact thermocouple positioned to measure temperature near the outer peripheral edge of the susceptor assembly, wherein at least two thermocouples are connected to a support bar connected to a base, the base fixed so that the support bar can move between non-contact and contact positions to move the thermocouples connected to the support bar at the same time.

9. The processing chamber of claim 8, further comprising an actuator connected support bar to move the thermocouples connected to the support bar at the same time.

10. The processing chamber of claim 8, further comprising a controller in communication with the at least one sensor to analyze data from the sensor.

* * * * *